United States Patent [19]
Hikida

[11] Patent Number: 5,328,858
[45] Date of Patent: Jul. 12, 1994

[54] METHOD FOR PRODUCING THE BIPOLAR TRANSISTOR

[75] Inventor: Satoshi Hikida, Nara, Japan

[73] Assignee: Sharp Kabushiki Kaisha, Osaka, Japan

[21] Appl. No.: 956,865

[22] Filed: Oct. 5, 1992

[30] Foreign Application Priority Data

Oct. 7, 1991 [JP] Japan .................. 3-258859

[51] Int. Cl.⁵ .................. H01L 21/265; H01L 29/70
[52] U.S. Cl. .................. 437/31; 437/154; 437/164; 257/552
[58] Field of Search .................. 437/31, 164, 154; 257/552

[56] References Cited

U.S. PATENT DOCUMENTS

| | | | |
|---|---|---|---|
| 3,656,034 | 4/1972 | Rideout | 257/552 |
| 3,665,266 | 5/1972 | Drozdowicz et al. | 257/552 |
| 3,787,253 | 1/1974 | Ashar | 257/552 |
| 4,125,426 | 11/1978 | Inayoshi et al. | 437/164 |
| 4,375,999 | 3/1983 | Nawata et al. | 437/164 |
| 4,404,738 | 9/1983 | Sasaki et al. | 437/31 |
| 5,021,860 | 6/1991 | Bertotti et al. | 257/552 |

FOREIGN PATENT DOCUMENTS 0128426  5/1990  Japan .................. 437/31

*Primary Examiner*—Robert Kunemund
*Assistant Examiner*—Long Pham
*Attorney, Agent, or Firm*—Nixon & Vanderhye

[57] ABSTRACT

A silicon oxide film is formed at a surface of a silicon substrate of a first conductive type, and then patterned to have an opening. PSG is deposited on the silicon substrate having the insulating film thereon, and then etched to leave the PSG only on a side wall of the opening. An impurity is implanted to the silicon substrate through the opening, and then thermal treatment is effected.

6 Claims, 4 Drawing Sheets

METHOD FOR PRODUCING THE BIPOLAR TRANSISTOR

BACKGROUND OF THE INVENTION

1. Field of the Invention:

The present invention relates to a semiconductor device and a method for producing the same, in particular, to a bipolar LSI and a BiMOS LSI and a method for producing the same.

2. Description of the Prior Art:

FIGS. 3a through 3d sequentially illustrate a common method for producing a bipolar LSI. The method will be described with reference to the figures.

AS is shown in FIG. 3a, an n+ buried layer 11 is formed in a specified pattern at a surface of a p-silicon substrate 10, and then an n− epitaxial layer 12 is formed by epitaxial growth.

Next, as is shown in FIG. 3b, a p+ isolating layer 14 is formed by diffusing a p+ ion in the n− epitaxial layer 12 for isolation. A silicon oxide film 13 is formed at a surface of the n− epitaxial layer 12 by selective oxidation. Then, an n+ collector region 15 is formed by diffusion of an n+ ion.

As is shown in FIG. 3c, a p-base region 16 is formed at an area of a surface of the n− epitaxial layer 12, the area having no silicon oxide film 13, and then an n+ emitter region 17 is formed within the p-base region 16.

As is shown in FIG. 3d, a window is formed in each of the n+ collector region 15, the p-base region 16, and the n+ emitter region 17, and then a collector electrode C, a base electrode B, and an emitter electrode E are formed at the respective windows in specified patterns by depositing aluminum by use of a sputtering method.

In a bipolar LSI produced in the abovementioned conventional method, a parasitic pnp transistor 18 is formed by the p-base region 16, the n− epitaxial layer 12, the p+ isolating layer 14 and the p-silicon substrate 10 as is shown in FIG. 4. The parasitic pnp transistor 18 causes problems such as latch-up during the operation of the bipolar LSI, which results in a malfunction.

SUMMARY OF THE INVENTION

The semiconductor device according to the present invention includes a semiconductor substrate of a first conductive type; a buried layer of a second conductive type formed in the semiconductor substrate; an epitaxial layer formed on the buried layer; an isolating layer formed in the epitaxial layer adjacently to the buried layer; and a base region formed in the epitaxial layer so as to be partially exposed outside. An end portion of the buried layer is projected upward in the epitaxial layer while being interposed between the base region and the isolating layer.

The method for producing a semiconductor device according to the present invention includes the steps of forming an insulating film at a surface of a semiconductor substrate of a first conductive type; forming an opening in the insulating film by removing a portion thereof where a buried layer of a second conductive type is to be formed; depositing an insulating glass containing phosphorus at a high concentration on the semiconductor substrate so as to cover the insulating film; anisotropically etching the insulating glass to leave the insulating glass only on a side wall of the opening; and implanting an impurity of a second conductive type into the semiconductor substrate through the opening and then effecting thermal treatment.

Thus, the invention described herein makes possible the advantages of providing a semiconductor device in which a gain of a parasitic pnp transistor can be small and thus a malfunction can be prevented and a method for producing such a semiconductor device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating examples with reference to the accompanying drawings.

A semiconductor device according to the present invention is produced as illustrated in FIGS. 1a through 1d.

Figure 1A:
FIGS. 1a through 1d are views sequentially illustrating each process of a method for producing a semiconductor device according to the present invention.

As is shown in FIG. 1a, a first silicon oxide film 2 is formed in a thickness of approximately 600 nm at a surface of a p-silicon substrate 1 by thermal oxidation, and then patterned to have an opening by removing an area of the first silicon oxide film 2 corresponding to an n+ buried layer 4 which is to be formed.

Figure 1B:
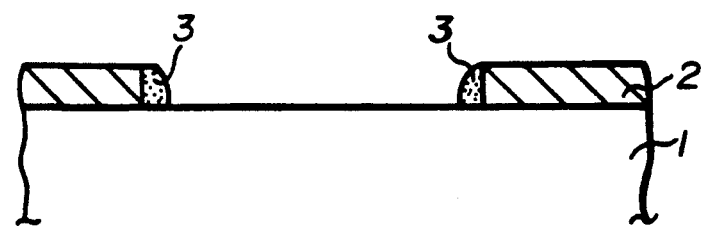

As is shown in FIG. 1b, PSG (phosphosilicate glass) containing phosphorus at a high concentration (for example, 10 to 20 wt.%) is deposited in a thickness of approximately 200 nm on the p-silicon substrate 1 so as to cover the first silicon oxide film 2. Then, the resultant PSG film is patterned by use of RIE (reactive ion etching) to be left only on side walls of the opening of the first silicon oxide film 2. Thus, PSG side walls 3 are formed.

Figure 1C:
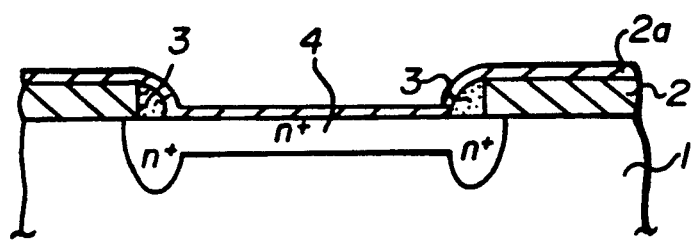

Next, as is shown in FIG. 1c, a second silicon oxide film 2a is formed by thermal oxidation at exposed surfaces of the p-silicon substrate 1, the first silicon oxide film 2, and the PSG side walls 3. Impurities having a small diffusion coefficient such as an antimony ion (diffusion coefficient: for example, $^{121}$Sb+) and an arsenic ion (diffusion coefficient: for example, $^{75}$As+) are implanted (for example, 20 KeV, $2\times10^{15}$ cm$^{-2}$), using the first silicon oxide film 2 as a mask. Then, the impurities are diffused into the p-silicon substrate 1 at a specified temperature (for example, 1,200° C). Thus, the n+ buried layer 4 (resistance: for example, 20 Ω/□) is formed. The n+ buried layer 4 contributes to lower the series resistance of a collector of an npn transistor. Simultaneously with the diffusion of the impurities, phosphorus contained in the PSG side walls 3 is diffused into the p-silicon substrate 1 as an impurity having a larger diffusion coefficient than antimony ion or arsenic ion, thereby forming an end portion of the n+ buried layer 4.

Figure 1D:
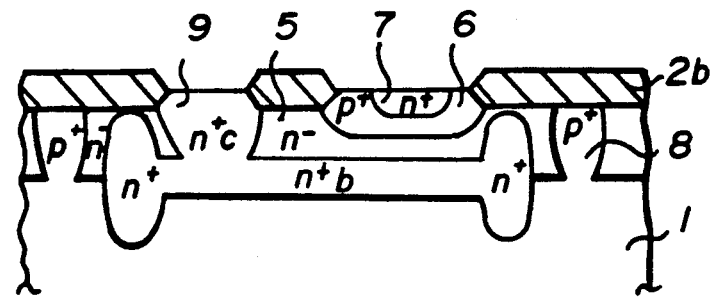

After the first and the second silicon oxide films 2 and 2a and the PSG side walls 3 are removed, an n⁻ epitaxial layer 5 is formed by epitaxial growth. Then, a third silicon oxide film 2b is formed in a thickness of 600 nm by selective thermal oxidation at a surface of the n⁻ epitaxial layer 5. Next, a p+ isolating layer 8 is formed by diffusing a p+ ion such as $^{11}B+$ for isolation, and an n+ collector region 9 is formed by diffusion of an n+ ion such as $^{31}P+$. A p+ base region 6 is formed in the n⁻ epitaxial layer 5 by diffusion of a p+ ion such as $^{11}B+$, and an n+ emitter region 7 is formed in the p+ base region 6 by diffusion of an n+ ion such as $^{75}As+$. By thermal treatment for forming the p+ isolating layer 8 and the n+ collector region 9, phosphorus which was implanted to the end portion of the n+ buried layer 4 before the formation of the n⁻ epitaxial layer 5 is diffused upward. Since the upward diffusion rate of phosphorus is higher than the diffusion rate of the antimony ion or the arsenic ion, a wall of the n+ ion is formed between the p+ base region 6 and the p+ isolating layer 8 as is shown in FIG. 1d. In this construction, the local concentration of a parasitic pnp transistor in the p+ base region 6 is significantly high, thereby remarkably reducing the gain of the pnp parasitic transistor.

Figure 2:
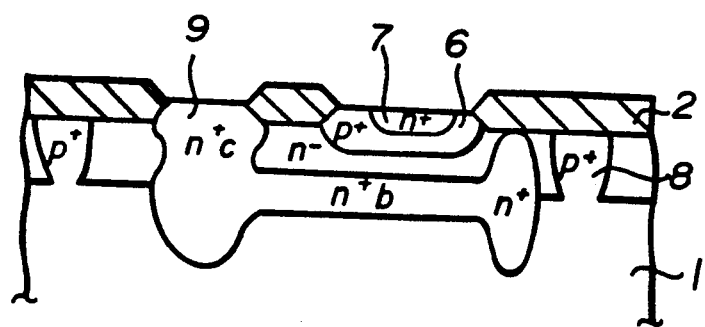
FIG. 2 is a partial cross sectional view showing a modification of a semiconductor device according to the present invention.
Figure 3A:
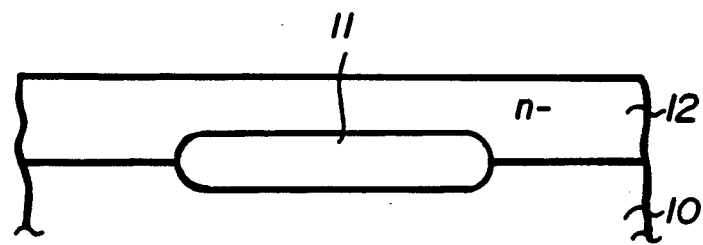
FIGS. 3a through 3d are views sequentially illustrating each process of a conventional method for producing a bipolar LSI.
Figure 3B:
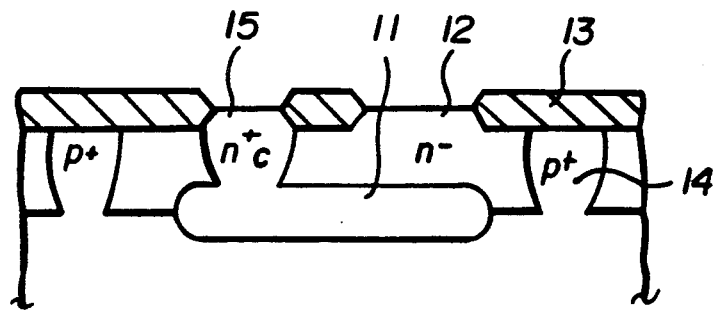
Figure 3C:
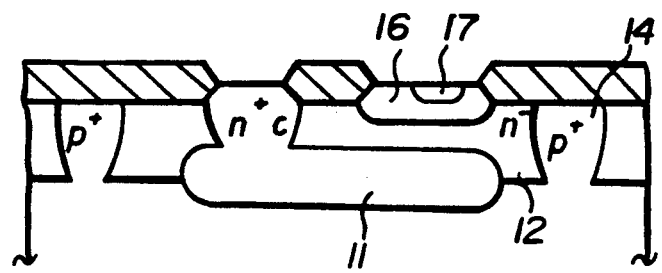
Figure 3D:
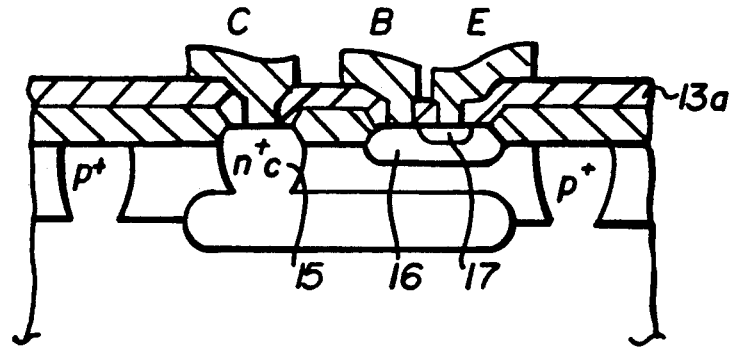
Figure 4:
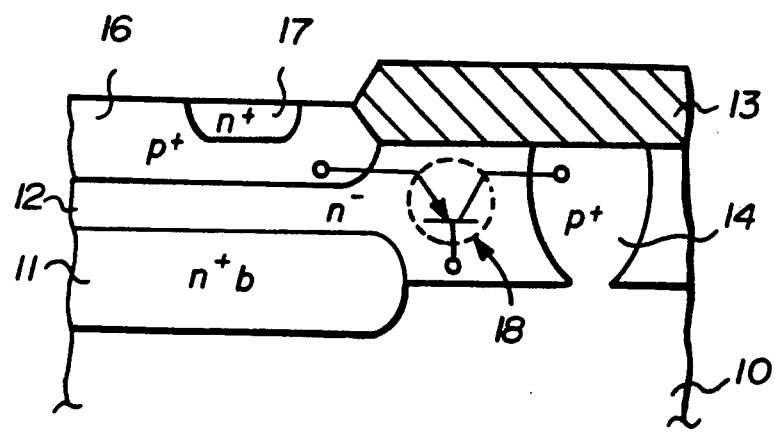
FIG. 4 is a partial cross sectional view of the bipolar LSI produced by the conventional method of FIG. 3.

As is shown in FIG. 2. phosphorus may be diffused upward to form the n+ collector region 9 below an area where the PSG side wall 3 wall was formed and further the third silicon oxide film 2b is not formed. The silicon oxide films 2, 2a and 2b can also be formed by a CVD method.

As has been described so far, according to the present invention, phosphorus having a large diffusion coefficient is diffused from a PSG side wall to a substrate, whereby an n+ buried layer including a portion having a larger diffusion coefficient than the remaining portion is formed. Then, by thermal treatment for forming a p+ isolating region and an n+ collector region, the phosphate in the n+ buried region is diffused upward to form an n+ projected end portion. The n+ projected end portion is on an outer periphery of an n+ emitter region. Since the local concentration of a pnp parasitic transistor in a p+ base region is significantly high owing to such a construction, the gain of the pnp parasitic transistor can remarkably be reduced. Moreover, the n+ projected end portion is formed in self alignment with the n+ emitter region without increasing the number of production processes compared with the conventional method. As a result, a highly reliable semiconductor device in which a malfunction such as latch-up is prevented can be produced by a simple method.

Various other modifications will be apparent to and can be readily made by those skilled in the art without departing from the scope end spirit of this invention. Accordingly, it is not intended that the scope of the claims appended hereto be limited to the description as set forth herein, but rather that the claims be broadly construed.

What is claimed is:

1. A method for producing a semiconductor device, comprising the steps of:

forming an insulating film at a surface of a semiconductor substrate of a first conductive type;

forming an opening in the insulating film by removing a portion thereof where a buried layer of a second conductive type is to be formed;

depositing an insulating glass containing phosphorus at a high concentration on the semiconductor substrate so as to cover the insulating film;

anisotropically etching the insulating glass to leave the insulating glass only on a side wall of the opening; and implanting an impurity of a second conductive type into the semiconductor substrate through the opening and then affecting thermal treatment.

2. A method for producing a semiconductor device according to claim 1, wherein the impurity has a smaller diffusion coefficient than that of phosphorus.

3. A method for producing a semiconductor device according to claim 1, wherein the thermal treatment comprises the steps of:

forming an epitaxial layer in an upper portion of the semiconductor layer;

forming an isolating layer in the epitaxial layer; and forming a collector region in the epitaxial layer.

4. A method for producing a semiconductor device according to claim 3, further comprising the steps of:

forming a base region in the epitaxial layer; and forming an emitter region in the base region.

5. A method for producing a semiconductor device according to claim 1, further comprising the step of forming a different insulating film at a selected area of a surface of the epitaxial layer.

6. A method for producing a semiconductor device according to claim 1, further comprising the step of forming a collector region below an area where the side wall was formed and, further, no insulating film is formed.

* * * * *

UNITED STATES PATENT AND TRADEMARK OFFICE
CERTIFICATE OF CORRECTION

PATENT NO. : 5,328,858
DATED : July 12, 1994
INVENTOR(S) : Satoshi HIKIDA

It is certified that error appears in the above-indentified patent and that said Letters Patent is hereby corrected as shown below:

Column 1, line 16, "AS" should be --As--.

Column 4, line 26, "affecting" should be --effecting--.

Signed and Sealed this

Eleventh Day of October, 1994

Attest:

BRUCE LEHMAN

*Attesting Officer*  *Commissioner of Patents and Trademarks*